US011017850B2

(12) United States Patent
Getreuer et al.

(10) Patent No.: US 11,017,850 B2
(45) Date of Patent: May 25, 2021

(54) MASTER SET OF READ VOLTAGES FOR A NON-VOLATILE MEMORY (NVM) TO MITIGATE CROSS-TEMPERATURE EFFECTS

(71) Applicant: Seagate Technology LLC, Cupertino, CA (US)

(72) Inventors: Kurt Walter Getreuer, Colorado Springs, CO (US); Darshana H. Mehta, Shakopee, MN (US); Antoine Khoueir, Apple Valley, MN (US); Christopher Joseph Curl, Colorado Springs, CO (US)

(73) Assignee: Seagate Technology LLC, Fremont, CA (US)

(*) Notice: Subject to any disclaimer, the term of this patent is extended or adjusted under 35 U.S.C. 154(b) by 0 days.

(21) Appl. No.: 16/547,925

(22) Filed: Aug. 22, 2019

(65) Prior Publication Data

US 2021/0057024 A1 Feb. 25, 2021

(51) Int. Cl.
| | |
|---|---|
| *G11C 11/34* | (2006.01) |
| *G11C 11/56* | (2006.01) |
| *G11C 16/26* | (2006.01) |
| *G11C 16/34* | (2006.01) |
| *H03M 13/11* | (2006.01) |
| *G06F 11/07* | (2006.01) |

(52) U.S. Cl.
CPC ........ *G11C 11/5642* (2013.01); *G06F 11/076* (2013.01); *G06F 11/0727* (2013.01); *G06F 11/0793* (2013.01); *G11C 11/5628* (2013.01); *G11C 16/26* (2013.01); *G11C 16/3404* (2013.01); *H03M 13/1111* (2013.01)

(58) Field of Classification Search
CPC . G11C 11/5642; G11C 11/5628; G11C 16/24; G11C 16/3404; G11C 11/0727; G11C 11/076; G11C 11/0793; G11C 11/26; G06F 11/0727; G06F 11/076
See application file for complete search history.

(56) References Cited

U.S. PATENT DOCUMENTS

| | | | |
|---|---|---|---|
| 6,337,778 B1 | 1/2002 | Gagne | |
| 6,559,538 B1 | 5/2003 | Pomerene et al. | |
| 6,856,534 B2 * | 2/2005 | Rodriguez | G11C 11/22 365/109 |

(Continued)

*Primary Examiner* — Pho M Luu
(74) *Attorney, Agent, or Firm* — Hall Estill Attorneys at Law

(57) ABSTRACT

Method and apparatus for managing data in a non-volatile memory (NVM) of a storage device, such as a solid-state drive (SSD). In some embodiments, first data are read from the NVM using an initial set of read voltages over a selected range of cross-temperature differential (CTD) values comprising a difference between a programming temperature at which the first data are programmed to the NVM cells and a reading temperature at which the first data are subsequently read from the NVM cells. A master set of read voltages is thereafter selected that provides a lowest acceptable error rate performance level over the entirety of the CTD range, and the master set of read voltages is thereafter used irrespective of NVM temperature. In some cases, the master set of read voltages may be further adjusted for different word line addresses, program/erase counts, read counts, data aging, etc.

19 Claims, 8 Drawing Sheets

(56) References Cited

U.S. PATENT DOCUMENTS

| | | |
|---|---|---|
| 8,040,725 B2 | 10/2011 | Kang |
| 8,095,851 B2 | 1/2012 | Diggs et al. |
| 8,213,255 B2 | 7/2012 | Hemink et al. |
| 8,344,475 B2 | 1/2013 | Shaeffer et al. |
| 8,472,274 B2 | 6/2013 | Fai et al. |
| 9,076,545 B2 | 7/2015 | Mokhlesi |
| 9,183,000 B2 | 11/2015 | Ichida et al. |
| 9,201,728 B2 | 12/2015 | Patapoutian et al. |
| 9,275,741 B1 | 3/2016 | Liang et al. |
| 9,286,933 B2 | 3/2016 | Mathew et al. |
| 9,443,603 B2 * | 9/2016 | Kim .................... G06F 12/0246 |
| 9,524,791 B1 * | 12/2016 | Kim ...................... G11C 16/20 |
| 9,659,664 B1 | 5/2017 | Griffin et al. |
| 9,668,337 B2 | 5/2017 | Stoev et al. |
| 10,521,353 B2 * | 12/2019 | Lim .................... G11C 29/021 |
| 2003/0189778 A1 | 10/2003 | Elliott et al. |
| 2010/0053787 A1 | 3/2010 | Mathew et al. |
| 2010/0053793 A1 | 3/2010 | Mathew et al. |
| 2010/0118433 A1 | 5/2010 | Buch |
| 2012/0275278 A1 | 11/2012 | Wilson |

\* cited by examiner

MASTER SET OF READ VOLTAGES FOR A NON-VOLATILE MEMORY (NVM) TO MITIGATE CROSS-TEMPERATURE EFFECTS

SUMMARY

Various embodiments of the present disclosure are generally directed to a method and apparatus for preemptively mitigating cross-temperature effects in a non-volatile memory (NVM), such as but not limited to a three-dimensional (3D) NAND flash memory device.

In some embodiments, first data are read from the NVM using an initial set of read voltages over a selected range of cross-temperature differential (CTD) values comprising a difference between a programming temperature at which the first data are programmed to the NVM cells and a reading temperature at which the first data are subsequently read from the NVM cells. A master set of read voltages is thereafter selected that provides a lowest acceptable error rate performance level over the entirety of the CTD range, and the master set of read voltages is thereafter used irrespective of NVM temperature. In some cases, the master set of read voltages may be further adjusted for different word line addresses, program/erase counts, read counts, data aging, etc.

These and other features and advantages which characterize the various embodiments of the present disclosure can be understood in view of the following detailed discussion and the accompanying drawings.

DETAILED DESCRIPTION

Figure 1:
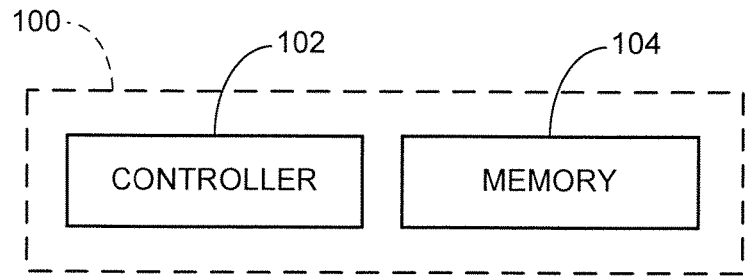
FIG. 1 provides a functional block representation of a data storage device constructed and operated in accordance with various embodiments of the present disclosure.

The present disclosure generally relates to systems and methods for storing data in a non-volatile memory (NVM).

Many current generation data storage devices such as solid state drives (SSDs) utilize NAND flash memory to provide non-volatile storage of data from a host device. Flash memory generally operates to store data in the form of accumulated electrical charge on a floating gate of each memory cell in the flash array. The programmed state can be sensed through the application of one or more read sense voltages to the cell.

These and other forms of erasable memories generally operate by being programmed to store data during a program (write) operation. Once programmed, the data may be read from the associated memory cells during subsequent read operations. The memory cells require an erasure operation to reset the memory cells before the cells can store replacement data. Each program/erase cycle is sometimes referred to as a PE cycle or PE count. A flash memory has a limited total number of PE counts that can be experienced during the operational life of the memory before the memory is worn out and no longer usable.

A limitation that has been observed with these and other forms of semiconductor based NVM is sometimes referred to as a cross-temperature effect. As used herein, the term "cross-temperature" relates to a difference (delta) between the temperature of the memory at the time of the programming of a set of data, and the temperature of the memory at a subsequent time when the set of data are read out from the memory.

If the cross-temperature delta ("CTD") is low, the system tends to provide manageable and consistent numbers of bit errors during read operations. The bit errors may be measured as a bit error rate (BER), which can be stated as a ratio of the number of bit errors to the number of total bits read.

BER can increase significantly with larger cross-temperature differentials. Large CTD values can arise due to a variety of factors including ambient temperature changes, variations in power consumption and workload, and so on. CTD variations are among the leading causes of reliability and data transfer performance degradation in SSDs and other semiconductor based data storage devices.

Accordingly, various embodiments of the present disclosure are generally directed to mitigating the effects of large CTD values and variations thereof in a data storage device, such as but not limited to an SSD that uses 3D NAND flash memory.

As explained below, some embodiments provide a data storage device with a controller circuit and a non-volatile memory (NVM). The controller circuit is configured to write data to the NVM responsive to write commands and data supplied by a host device, and subsequently read and return the data from the NVM responsive to read commands from the host device.

The controller is configured to generate a master set of read voltage points that provide acceptable error rate performance over a widest practical range of variations in CTD. This allows the same set of read voltage points to be applied to the memory irrespective of temperature at the time of reading. The master set may be generated using history data that is accumulated over time. The master set may also be generated by performing special calibration operations during a background operation.

The master set can be adjusted using various other factors such as PE counts, data retention (aging), read disturb rates, and locations (e.g., different word lines within a given erasure block, etc.).

In some cases, the controller establishes the master set of read voltage points by collecting history data over time during read operations using different sets of read voltage points at various temperatures. The final (master) set is selected that provides the best error rate performance across a largest range of the CTD values. The master set is thereafter used, including being adjusted as required, during subsequent reads. It is contemplated albeit not necessarily required that different read voltage set points will be provided for each word line in each erasure block.

In some cases, temperature measurements become unnecessary during reads since the same master set is applied irrespective of temperature. In other cases, a main master set may be used for most reads, but one or more auxiliary sets will be generated for exception cases (e.g., very low temperatures below a first threshold, very high temperatures above a second threshold, etc.).

These and other features and advantages of various embodiments can be understood beginning with a review of FIG. 1 which provides a functional block diagram of an exemplary data storage device 100. The device 100 is characterized as a solid-state drive (SSD) that employs non-volatile semiconductor memory such as 3D NAND flash memory, although the present disclosure is not so limited.

The device 100 includes a controller circuit 102 which provides top-level control and communication functions as the device interacts with a host device (not shown) to store and retrieve host user data. A memory module 104 provides non-volatile storage of the data in the form of an array of flash memory cells.

The controller 102 may be a programmable CPU processor that operates in conjunction with programming stored in a computer memory within the device. The controller may alternatively be a hardware controller. The controller may be a separate circuit or the controller functionality may be incorporated directly into the memory array 104.

As used herein, the term controller and the like will be broadly understood as an integrated circuit (IC) device or a group of interconnected IC devices that utilize a number of fundamental circuit elements such as but not limited to transistors, diodes, capacitors, resistors, inductors, waveguides, circuit paths, planes, printed circuit boards, memory elements, etc. to provide a functional circuit regardless whether the circuit is programmable or not. The controller may be arranged as a system on chip (SOC) IC device, a programmable processor, a state machine, a hardware circuit, a portion of a read channel in a memory module, etc.

Figure 2:
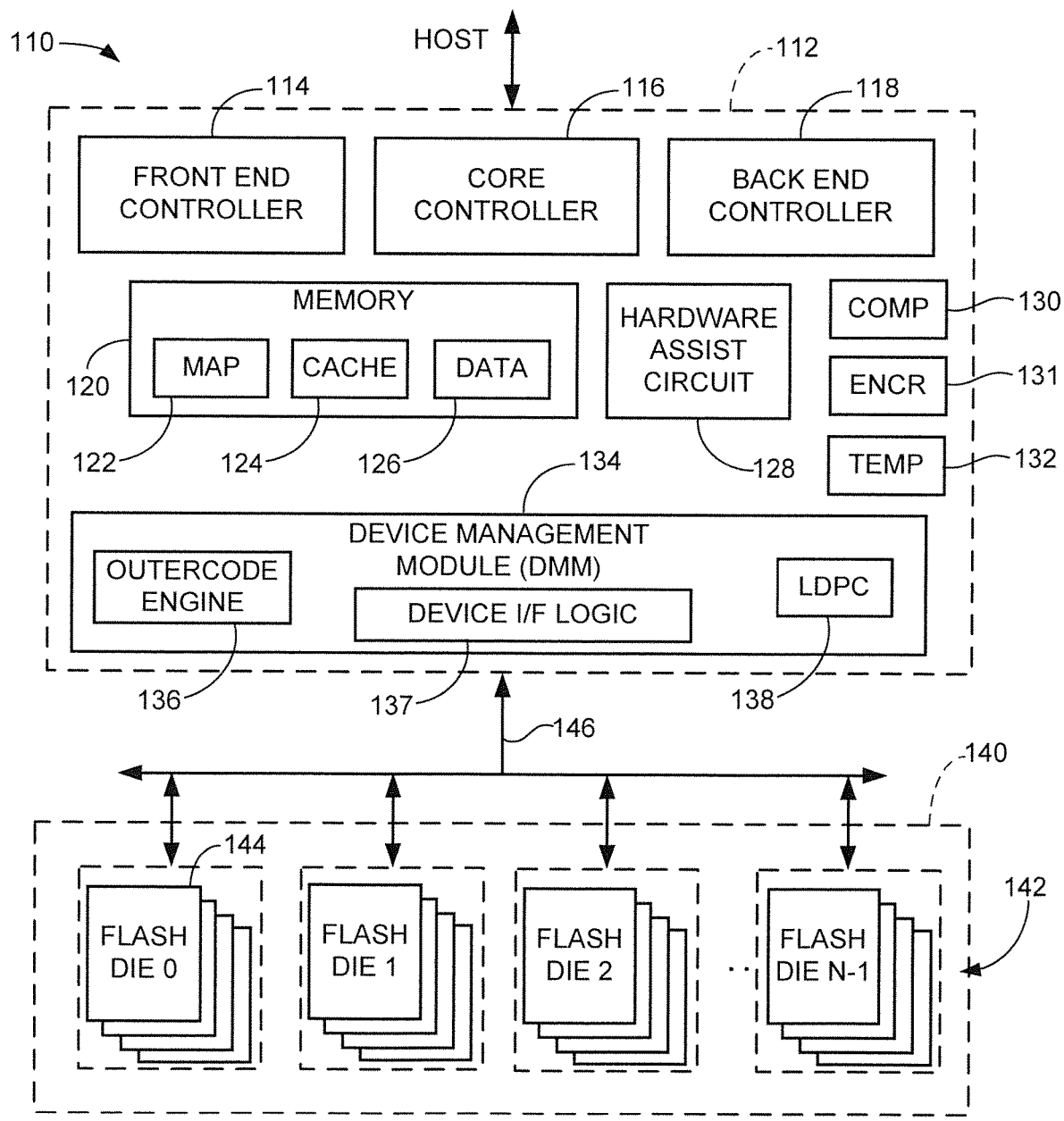
FIG. 2 illustrates the data storage device of FIG. 1 characterized as a solid state drive (SSD) that uses NAND flash memory in accordance with some embodiments.

In order to provide a detailed explanation of various embodiments, FIGS. 2 through 6 have been provided to describe relevant aspects of an exemplary data storage device 110 corresponding to the device 100 of FIG. 1. The device 110 is shown in FIG. 2 to be configured as a solid state drive (SSD) that communicates with one or more host devices via one or more Peripheral Component Interface Express (PCIe) ports. The NVM is contemplated as comprising NAND flash memory, although other forms of solid state non-volatile memory can be used.

In at least some embodiments, the SSD operates in accordance with the NVMe (Non-Volatile Memory Express) Standard, which enables different users to allocate NVM sets (die sets) for use in the storage of data. Each die set may form a portion of an NVMe Namespace that may span multiple SSDs or be contained within a single SSD. Each NVMe Namespace will be owned and controlled by a different user (owner). While aspects of various embodiments are particularly applicable to devices operated in accordance with the NVMe Standard, such is not necessarily required.

The SSD 110 includes a controller circuit 112 with a front end controller 114, a core controller 116 and a back end controller 118. The front end controller 114 performs host I/F functions, the back end controller 118 directs data transfers with the memory module 114 and the core controller 116 provides top level control for the device.

Each controller 114, 116 and 118 includes a separate programmable processor with associated programming (e.g., firmware, FW) in a suitable memory location, as well as various hardware elements to execute data management and transfer functions. This is merely illustrative of one embodiment; in other embodiments, a single programmable processor (or less/more than three programmable processors) can be configured to carry out each of the front end, core and back end processes using associated FW in a suitable memory location. A pure hardware based controller configuration can alternatively be used. The various controllers may be integrated into a single system on chip (SOC) integrated circuit device, or may be distributed among various discrete devices as required.

A controller memory 120 represents various forms of volatile and/or non-volatile memory (e.g., SRAM, DDR DRAM, flash, etc.) utilized as local memory by the controller 112. Various data structures and data sets may be stored by the memory including one or more map structures 122, one or more caches 124 for map data and other control information, and one or more data buffers 126 for the temporary storage of host (user) data during data transfers.

A non-processor based hardware assist circuit 128 may enable the offloading of certain memory management tasks by one or more of the controllers as required. The hardware circuit 128 does not utilize a programmable processor, but instead uses various forms of hardwired logic circuitry such as application specific integrated circuits (ASICs), gate logic circuits, field programmable gate arrays (FPGAs), etc.

Additional functional blocks can be realized in or adjacent the controller 112, such as a data compression block 130, an encryption block 131 and a temperature sensor block 132. The data compression block 130 applies lossless data compression to input data sets during write operations, and subsequently provides data de-compression during read operations. The encryption block 131 applies cryptographic functions including encryption, hashes, decompression, etc. The temperature sensor 132 senses temperature of the SSD at various locations.

A device management module (DMM) 134 supports back end processing operations and may include an outer code engine circuit 136 to generate outer code, a device I/F logic circuit 137 and a low density parity check (LDPC) circuit 138 configured to generate and use LDPC codes as part of the error detection and correction strategy used to protect the data stored by the SSD 110.

A memory module 140 corresponds to the memory 104 in FIG. 1 and includes a non-volatile memory (NVM) in the form of a flash memory 142 distributed across a plural number N of flash memory dies 144. Flash memory control electronics (not separately shown in FIG. 2) may be provisioned on each die 144 to facilitate parallel data transfer operations via a number of channels (lanes) 146.

Figure 3:
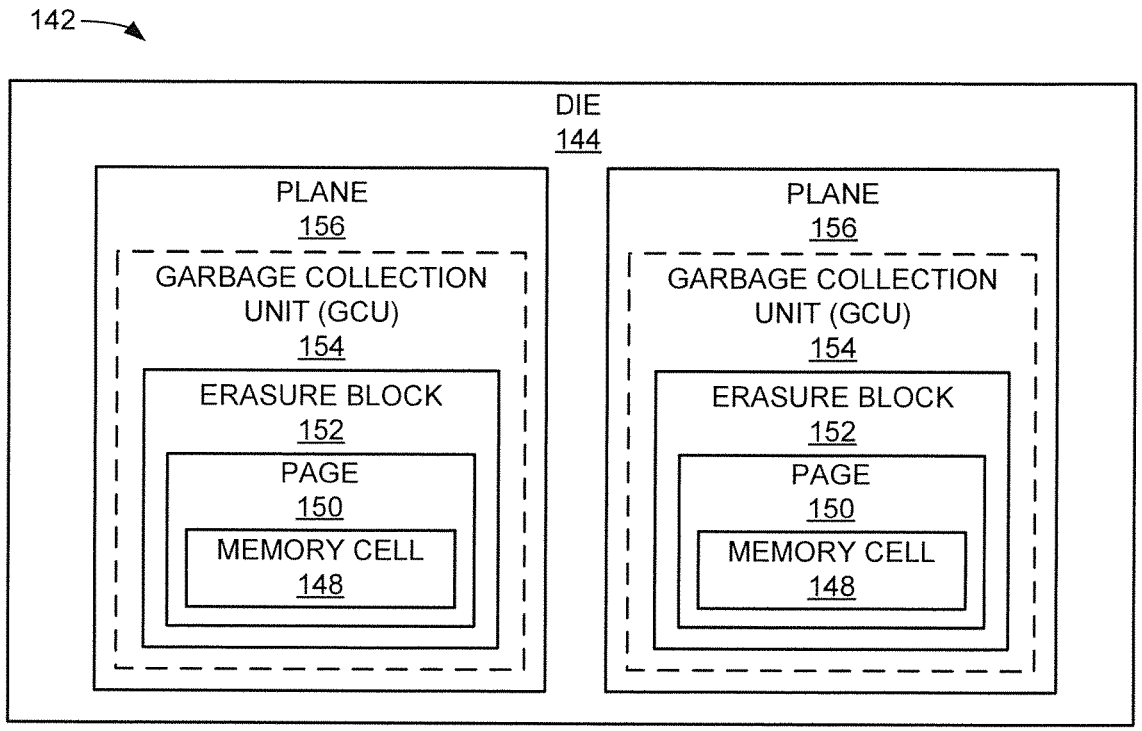
FIG. 3 is a physical and functional layout of the flash memory of FIG. 2 in some embodiments.

FIG. 3 shows a physical/logical arrangement of the various flash memory dies 144 in the flash memory 142 of FIG. 2 in some embodiments. Each die 144 incorporates a large number of flash memory cells 148. The cells may be arrayed in a two-dimensional (2D) or three-dimensional (3D stacked) arrangement with various control lines (e.g., source, bit, word lines) to access the cells.

Groups of cells 148 are interconnected to a common word line to accommodate pages 150, which represent the smallest unit of data that can be accessed at a time. Depending on the storage scheme, multiple pages of data may be written to the same physical row of cells, such as in the case of MLCs (multi-level cells), TLCs (three-level cells), QLCs (four-level cells), and so on. Generally, n bits of data can be stored to a particular memory cell 148 using $2^n$ different charge states (e.g., TLCs use eight distinct charge levels to represent three bits of data, etc.). The storage size of a page can vary; some current generation flash memory pages are arranged to store 16 KB (16,384 bytes) of user data.

The memory cells 148 associated with a number of pages are integrated into an erasure block 152, which represents the smallest grouping of memory cells that can be concurrently erased in a NAND flash memory. A number of erasure blocks 152 are turn incorporated into a garbage collection unit (GCU) 154, which are logical storage units that utilize erasure blocks across different dies as explained below. GCUs are allocated and erased as a unit, and tend to span multiple dies.

During operation, a selected GCU is allocated for the storage of user data, and this continues until the GCU is filled. Once a sufficient amount of the stored data is determined to be stale (e.g., no longer the most current version), a garbage collection operation can be carried out to recycle the GCU. This includes identifying and relocating the current version data to a new location (e.g., a new GCU), followed by an erasure operation to reset the memory cells to an erased (unprogrammed) state. The recycled GCU is returned to an allocation pool for subsequent allocation to begin storing new user data. In one embodiment, each GCU 154 nominally uses a single erasure block 152 from each of a plurality of dies 144, such as 32 dies.

Each die 144 may further be organized as a plurality of planes 156. Examples include two planes per die as shown in FIG. 3, although other numbers of planes per die, such as four or eight planes per die can be used. Generally, a plane is a subdivision of the die 144 arranged with separate read/write/erase circuitry such that a given type of access operation (such as a write operation, etc.) can be carried out simultaneously by each of the planes to a common page address within the respective planes.

Figure 4:
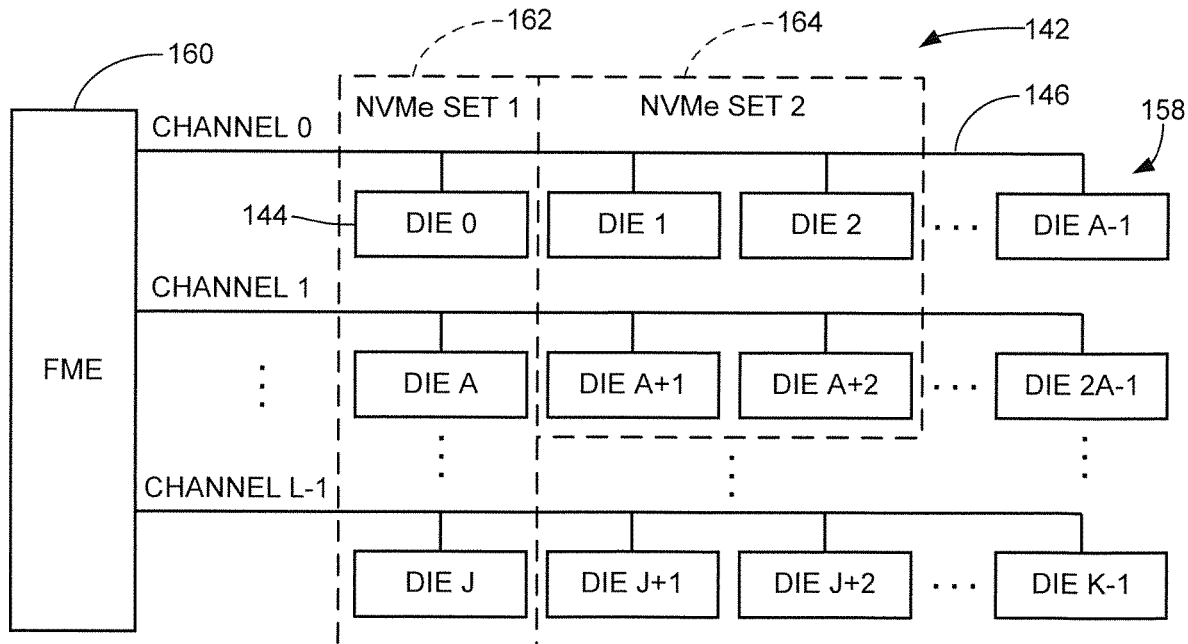
FIG. 4 shows the grouping of various dies of the flash memory of FIG. 2 in various die and NVM sets in some embodiments.

FIG. 4 shows further aspects of the flash memory 142 in some embodiments. A total number K dies 144 are provided and arranged into physical die groups 158. Each die group 158 is connected to a separate channel 146 using a total number of L channels. Flash memory electronics (FME) circuitry 160 of the flash memory module 142 controls each of the channels 146 to transfer data to and from the respective die groups 158. In one non-limiting example, K is set to 128 dies, L is set to 8 channels, and each physical die group has 16 dies. In this way, any of the 16 dies physically connected to a given channel 146 can be accessed at a given time using the associated channel. Generally, only one die per channel can be accessed at a time.

In some embodiments, the various dies are arranged into one or more NVMe sets. An NVMe set, also referred to as a die set, represents a portion of the storage capacity of the SSD that is allocated for use by a particular host (user/owner). NVMe sets are established with a granularity at the die level, so that each NVMe set will encompass a selected number of the available dies 144.

A first example NVMe set is denoted at 162 in FIG. 4. This first set 162 uses a single die 144 from each of the different channels 146. This arrangement provides fast performance during the servicing of data transfer commands for the set since all eight channels 146 are used to transfer the associated data to service a host access command. A limitation with this approach is that if the set 162 is being serviced, no other NVM sets can be serviced during that time interval. While the set 162 only uses a single die from each channel, the set could also be configured to use multiple dies from each channel, such as four (4) dies per channel for a total of 32 dies.

A second example NVMe set is denoted at 164 in FIG. 4. This set uses dies 144 from less than all of the available channels 146. This arrangement provides relatively slower overall performance during data transfers as compared to the set 162, since for a given size of data transfer, the data will be transferred using fewer channels. However, this arrangement advantageously allows the SSD to service multiple NVMe sets at the same time, provided the sets do not share a common channel 146.

Figure 5:
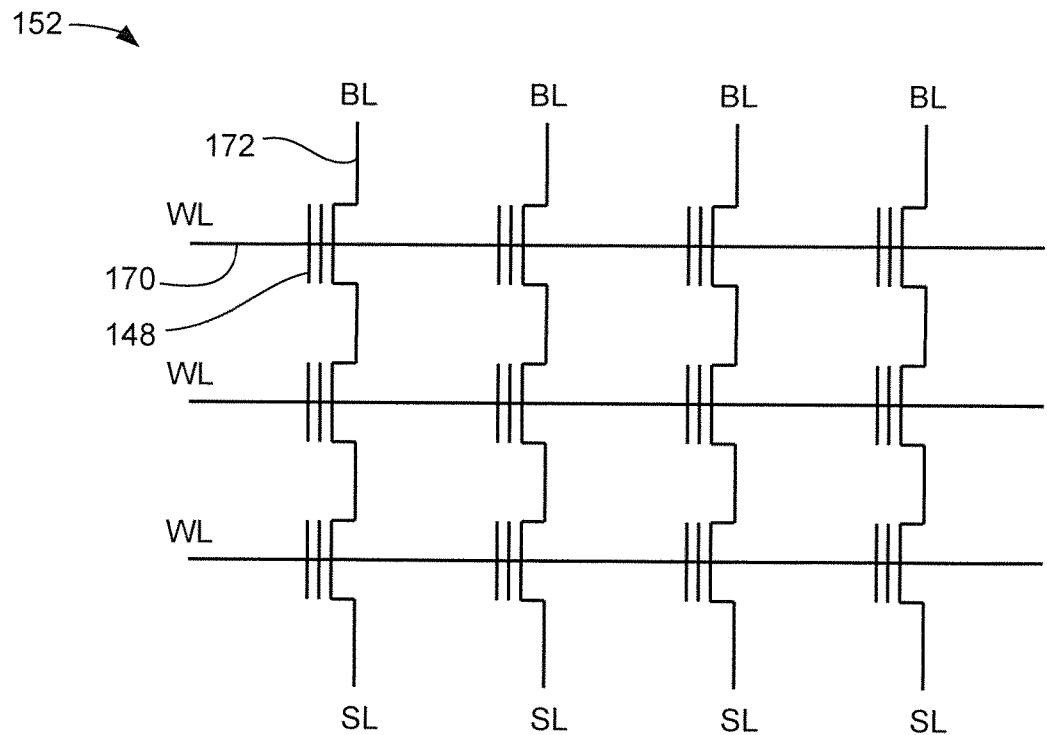
FIG. 5 provides a schematic depiction of a portion of the flash memory of FIG. 2 as operated by some embodiments.

FIG. 5 is a simplified schematic depiction of a portion of a selected erasure block 152 from FIG. 3. The flash memory cells 148 each generally take a MOSFET (metal oxide semiconductor field effect transistor) configuration with respective control gate, source and drain regions. A floating gate is isolated between the control gate and the channel between the source and drain.

The cells 148 are arranged in a matrix connected by word lines (WL) 170, bit lines (BL) 172 and source lines (SL) 174. During normal program (write) and read operations, current is passed from the BL to the SL through each stack in turn. This may take place by connecting the BL to a suitable rail voltage, such as 3.3V, and connecting the SL to a suitable reference level, such as electrical ground. The WLs 170 are connected to the control gates of the memory cells 148. Variable gate control voltages (read voltages) are supplied to the memory cells via the WLs to read the programmed states of the cells. Pages of data are stored along the memory cells attached to a common word line (WL). Programming (write), read and erase operations may be carried out by supplying different combinations of voltages to the respective control lines to respectively apply, sense or remove accumulated charge to or from the floating gates. These voltages are applied by presenting read voltage set points (multi-bit digital representations) that are converted to analog gate voltages by internal NAND read circuitry. The term "set points" and the like will thus be used herein to represent the settings established as inputs to the flash memory, although it will be understood that these are, in effect, read voltages, read levels, etc.

Figure 6:
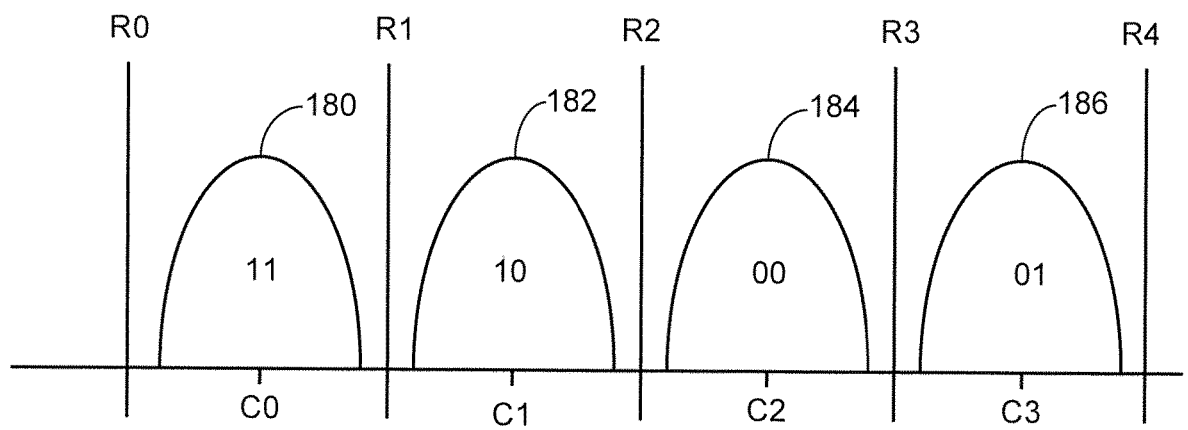
FIG. 6 shows charge distributions and associated read voltage set points for the flash memory of FIG. 2 that may be generated by some embodiments.

FIG. 6 shows different populations of charge distributions that may be applied to the various memory cells 148 in FIG. 5. For ease of discussion, FIG. 6 depicts MLC (multi-level cell) programming so that each memory cell can have up to four charge states to depict two (2) bits of programming. As noted above, other programming schemes can be used including TLC (8 charge states to depict 3 bits), QLC (16 charge bits to depict 4 bits), etc., so the depiction of MLCs is merely exemplary and is not limiting.

The four charge distributions C0-C3 are denoted at 180, 182, 184 and 186 and represent respective two-bit combinations of 11, 10, 00 and 01. Other encoding schemes can be used. For a given set of cells 148 attached to a common WL 170, the MSB stored in each cell represents a logical bit value from a first page of data and the LSB stored in each cell represents a logical bit value from a second page of data.

The read voltage set points (levels) R0-R4 represent control gate (read) voltages necessary to place the different populations of memory cells into a forward (source-to-drain) conductive state. The read voltage set point R2 is sufficient to place all of the memory cells in populations 180 and 182 in a conductive state, but not those cells in populations 184 and 186. The read voltage set point R4 is sufficiently high to place all of the cells in a forward conductive state, while the read voltage set point R0 is insufficient to place any of the cells in a forward conductive state. By applying different sequences of the read voltage set points R0-R4 during a read operation and sensing whether the associated cells become conductive, the individual charge state of the cells can be determined.

Figure 7A:
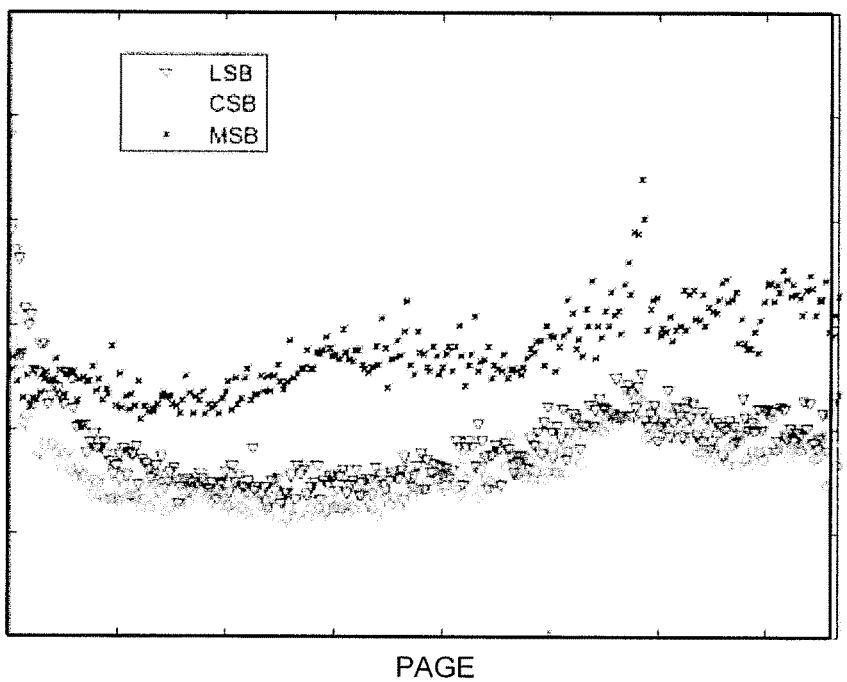
FIGS. 7A and 7B show graphical depictions of changes in bit error rate (BER) performance for different cross-temperature differentials (CTDs) of the SSD of FIG. 2.
Figure 7B:
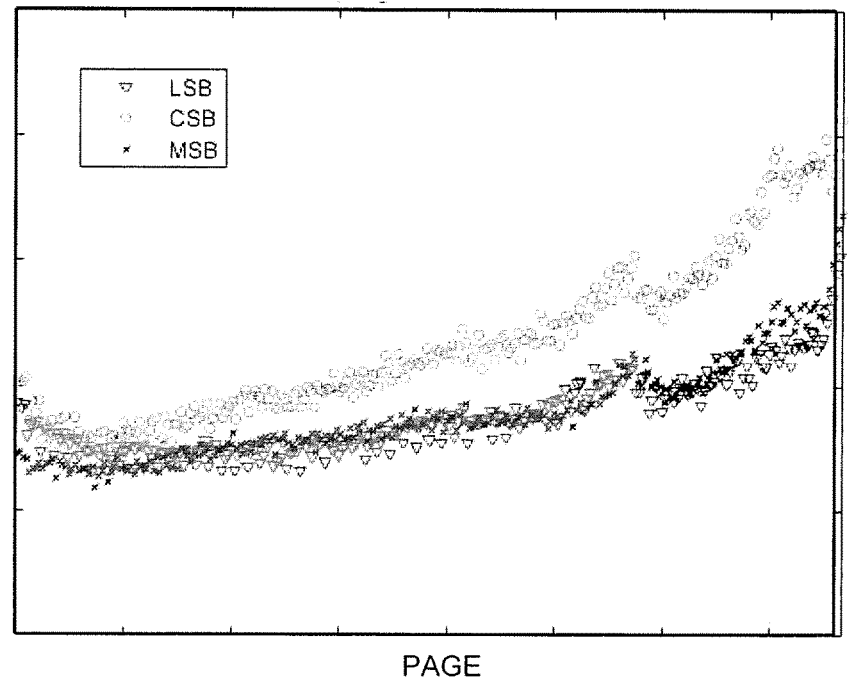

Having now provided an overview of the operation of the SSD 110 of FIG. 2, FIGS. 7A and 7B illustrate the effects on bit error rate (BER) performance for data stored to the flash memory 140 as described above under different temperature conditions.

FIG. 7A shows a graphical representation of BER data for different pages that have a relatively low cross-temperature differential (CTD) value; that is in FIG. 7A, both program and read temperatures were near the same temperature. The data are plotted for TLC cells (three bits per cell) for both reads on the least, center and most significant bits (LSB, CSB and MSB page types). It can be seen that, generally, steady state BER values can be obtained across a large sample of page values. Different page types, most notably the MSB page types, tend to provide worse BER performance.

FIG. 7B shows a graphical representation of BER data for different pages that have a relatively high CTD value, in this case, a read temperature that was about 70° C. higher than the program temperature. The BER values in FIG. 7B are several multitudes higher (e.g., 4× to 20× or more) as compared to the BER values in FIG. 7A, with the CSB page types exhibiting the worst BER performance for certain pages. It will be appreciated that different word line values/ locations (e.g., WLn) within various erasure blocks can provide significantly different CTD responses.

One reason that temperature excursions such as in FIG. 7B lead to increased BER values relates to charge drift; at higher temperatures, the various memory cells become conductive at different control gate (read) voltage levels so that read voltage set points such as the values R0-R4 in FIG. 6 may not be sufficient to accurately discern the programmed state of the individual cells.

Figure 8:
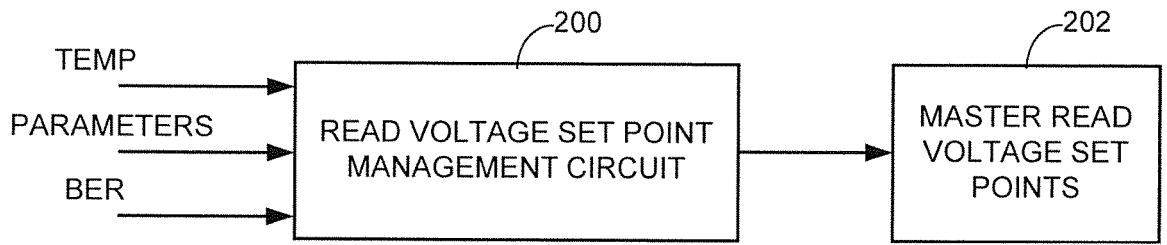
FIG. 8 shows a functional block representation of a read voltage set point (RVSP) management circuit constructed and operated in accordance with various embodiments.

Accordingly, FIG. 8 shows a functional block representation of a read voltage set point (RVSP) management circuit 200 constructed and operated in accordance with various embodiments to compensate for these and other limitations of the existing art. The circuit 200 can take a variety of forms based on the requirements of a given application. It is contemplated in some embodiments that the circuit 200 represents one or more firmware routines stored in a suitable memory location and executed by one or more processors of the SSD controller 112 discussed above (see FIG. 2). Other circuit configurations can be used.

Generally, the circuit 200 can be configured to operate as a background process to collect and analyze various types of parametric data related to the read performance of the memory 140. As explained below, the circuit evaluates BER read performance of various locations within the flash memory over time and in view of various parameters such as CTD, PE counts, data retention (aging), read counts, locations (e.g., WLn), etc.

The data are collected for different sets of read voltage set points used to read the data from the memory. Ultimately, the circuit 200 generates a master set of read voltage set points for each of a number of locations in the memory that provide acceptable levels of BER over a broadest range of CTD values. The master sets are stored in a suitable memory location 202 and thereafter used as required during subsequent reads.

The master sets may be selected during actual read operations to service read commands from a host. Additionally or alternatively, the circuit 200 may operate as a background operation to perform the evaluations as part of a calibration operation.

Figure 9:
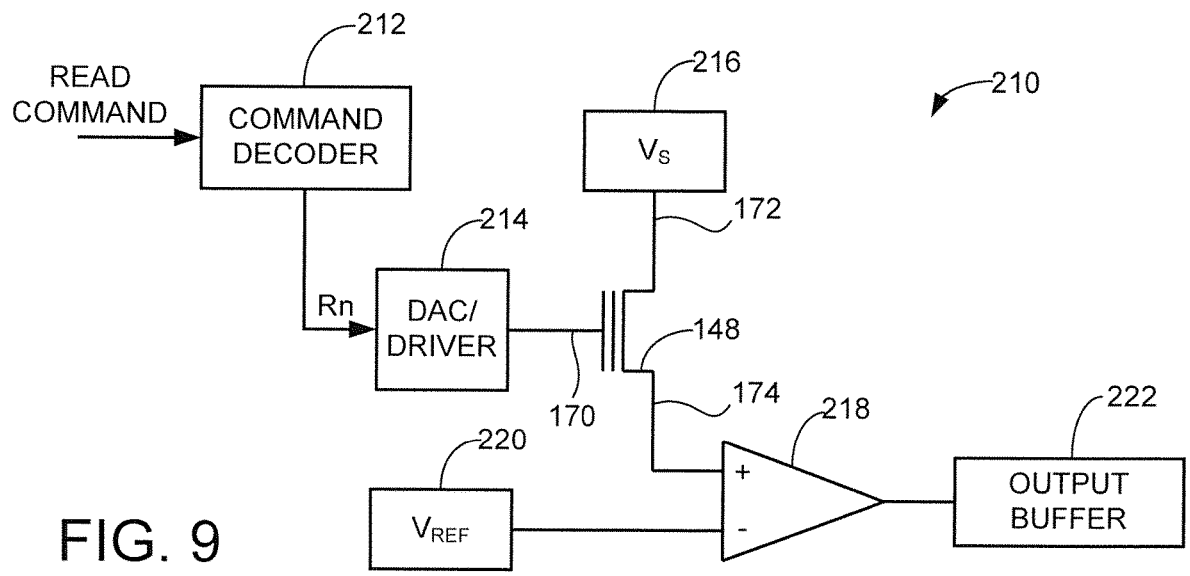
FIG. 9 shows a read circuit of the SSD in some embodiments.
Figure 10:
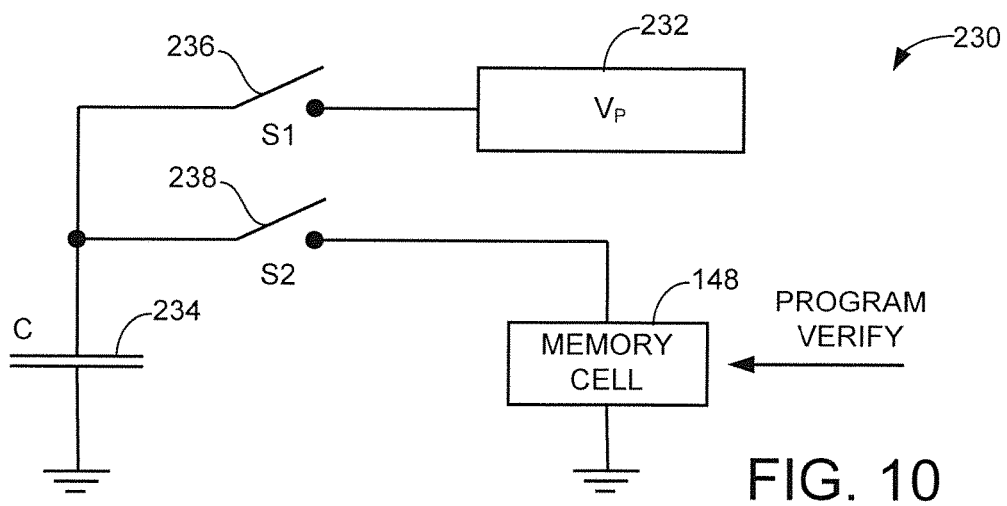
FIG. 10 shows a programming (write) circuit of the SSD in some embodiments.

To this end, FIGS. 9 and 10 have been provided to describe ways in which data may be programmed to and read from a selected memory cell using the master sets from the data structure 204. It will be appreciated that these techniques are successively applied to each of a group of memory cells (such as a row of memory cells in a selected erasure block) to write and read a page of data, respectively.

FIG. 9 is a functional block representation of a read/ program verify (PV) circuit 210 of the SSD 110 in accordance with some embodiments. The circuit 210 is adapted to apply read voltages during read operations to detect the program states of the respective memory cells 148 in the array 140, such as the read voltages R0-R4 in FIG. 6. Program verify operations during programming can also be carried out by the circuit, or a different dedicated circuit having a similar construction.

A command decoder 212 decodes an input read command and applies an appropriate read voltage set point Rn to a digital-to-analog (DAC) driver circuit 214. The read voltage set point Rn is a multi-bit digital representation of a selected analog control gate voltage value having a magnitude nominally selected to place the memory cell 148 in a forward conductive state based on the programmed state of the cell. The DAC/driver 214 applies the corresponding analog voltage to the control gate of the selected cell 148 via the associated word line (WL) 170 (see FIG. 5). The read voltage set points (Rn), also referred to as read levels, are stored and applied as multi-bit integers corresponding to DAC input values over the available DAC range.

A voltage source 216 applies a suitable source voltage Vs to the bit line (BL) 172 coupled to the memory cell 148 being read. A sense amplifier 218 coupled to the source line (SL) 174 determines whether the applied voltage is sufficient to place the cell into a conductive state through a comparison with a reference voltage $V_{REF}$ from a reference voltage source 220. A resulting bit value is output to an output buffer 222 (e.g., a 0 or 1) responsive to the comparison.

FIG. 10 is a functional block representation of a data programming circuit 230 of the SSD 110. The circuit 230 is configured to transfer charge to the floating gates of the various memory cells 148 during programming operations.

The circuit 230 takes a general charge pump configuration with a programming voltage source 232 that supplies a suitable programming voltage $V_P$, a capacitor (C) 234 or other charge storage device, and a pair of switches 236, 238 denoted as switches S1 and S2. The switches can take any suitable form such as power MOSFETs.

The circuit operates to transfer discrete quanta of charge to the floating gate. To this end, one or more charge-transfer cycles are applied to the memory cell. During a charge cycle, switch S1 is closed, switch S2 is opened, and charge accumulates as the voltage $V_P$ is applied to the capacitor C. During a transfer cycle, switch S1 is opened and switch S2 is closed, enabling a transfer of the charge accumulated by the capacitor C to the memory cell 148.

The foregoing sequence is repeated as required until the total amount of accumulated charge on the floating gate of the memory cell 148 reaches a desired level indicative of the programming of the cell to the desired programmed state. A program verify operation is periodically carried out to assess the then-existing program state of the cell, using the read circuit 210 of FIG. 9. A suitable program verify threshold is used, which may be different from the various read voltages depicted in FIG. 6.

Program verify and read operations are carried out in a similar fashion. One difference is that a read operation for a memory cell storing more than a single bit may require multiple different voltage thresholds to discern the program state, whereas a program verify operation may involve the application of only a single voltage to ensure sufficient charge has been accumulated on the floating gate.

As noted above, a large differential between the temperature at which a data set is programmed as compared to the temperature at which the data set is subsequently read can result in significant shifts in the effective voltage required to discern the associated programming state for the cells storing the data set. This is primarily manifested by higher (worse) BER values as CTD gets larger.

Figure 11:
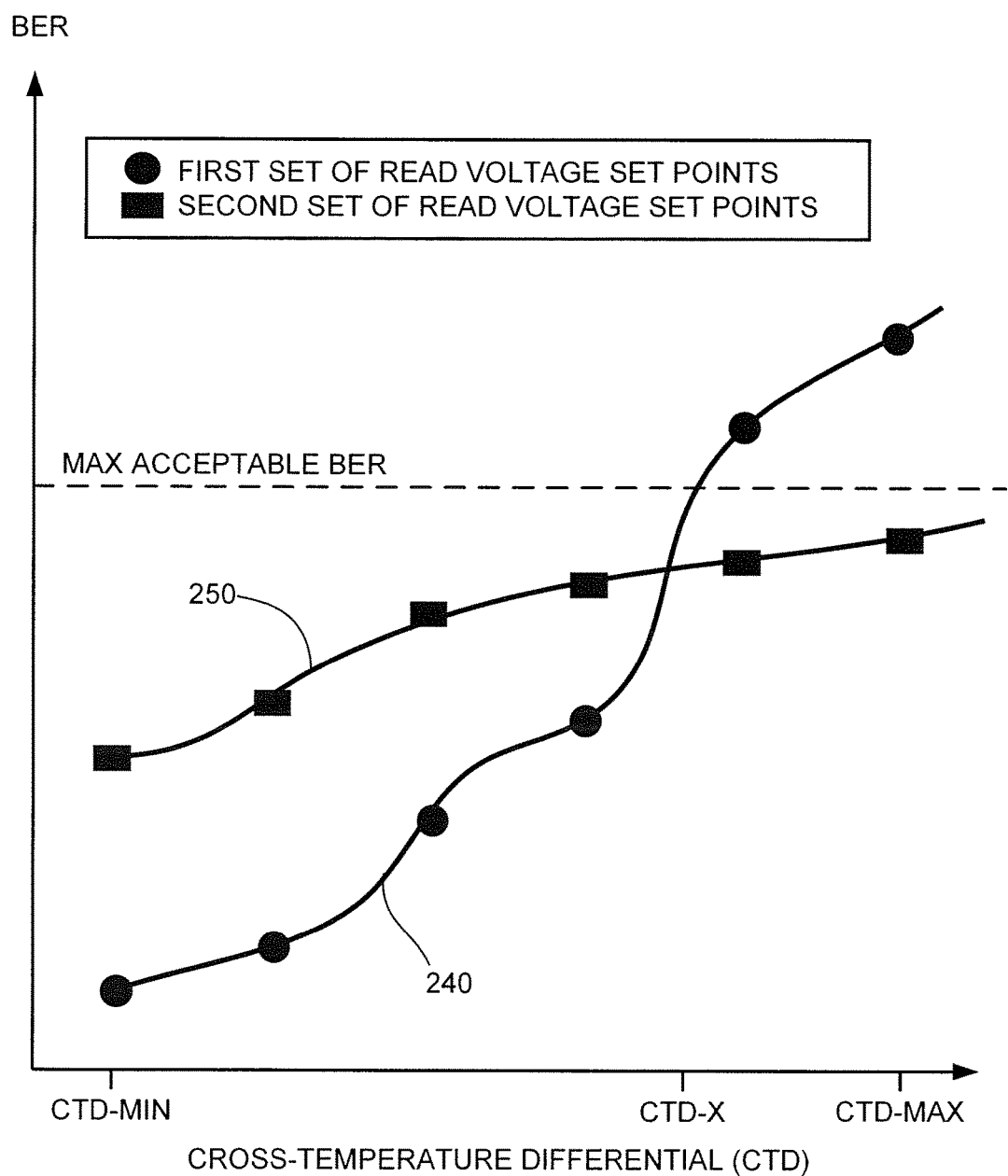
FIG. 11 is a simplified graphical depiction of error rate data obtained by the management circuit of FIG. 8.

FIG. 11 is a graphical representation of different BER curves 240, 250 for different sets of write voltage set points for a selected memory location. It will be understood that the curves are simplified for purposes of illustration. The first curve 240 represents BER performance for a first set of read voltages, and the second curve 250 represents BER performance for a second set of read voltages. In some cases, the cells at the selected location are arranged as TLCs so that each of the sets have set point values of R1 through R7. The data may combine all possible reads at that location (e.g., SLCs, MLCs and TLCs), or may be arranged for just one type of read (e.g., TLCs).

The curves 240, 250 are plotted against a CTD x-axis and a BER y-axis. The CTD x-axis extends from a minimum CTD value (CTD-MIN) to a maximum CTD value (CTD-MAX). Depending on the performance of the flash memory, the absolute magnitude of the CTD value may be used in cases where similar changes in BER occur irrespective of whether the programming temperature value (Tprog) was low and the reading temperature value (Tread) was high (e.g., Tprog<Tread), or vice versa (e.g., Tprog>Tread).

CTD-MIN may thus represent zero differential (e.g., CTD-MIN=0C) and CTD-MAX may represent some maximum amount of differential related to the operational specifications for the memory (e.g., CTD-MAX=100 C, etc.). Other respective values can be used. An optional threshold 260 represents a maximum acceptable BER value that can be tolerated by the system. It will be appreciated that the actual data that will likely be obtained will appear more like a scatterplot as in FIGS. 7A-7B, so curve fitting or other techniques can be applied by the circuit 200 to obtain data of the type illustrated in FIG. 11. Additional curves can be plotted for other variables such as different PE counts, different read counts, different aging, etc.

The curve 240 shows lower (better) BER performance at lower to mid-CTD values, but higher (worse) BER performance at higher CTD values. By contrast, the curve 250 shows more steady-state BER performance across the CTD range. Because one goal is to select a single, suitable set of read voltage set points that can be applied irrespective of temperature, in some embodiments the circuit 200 may select the second set (curve 250). However, because another goal is to minimize BER, in another embodiment the circuit 200 may utilize the first set (curve 240) up until a cross-over temperature CTD-X is reached, after which the second set (curve 250) will be used. In the former case, temperature measurements are unnecessary, while in the latter case, temperature measurements should still be taken albeit not necessarily as often as would otherwise be required, since all that is needed is an estimate of whether the system is on the left side or the right side of CTD-X.

Figure 12:
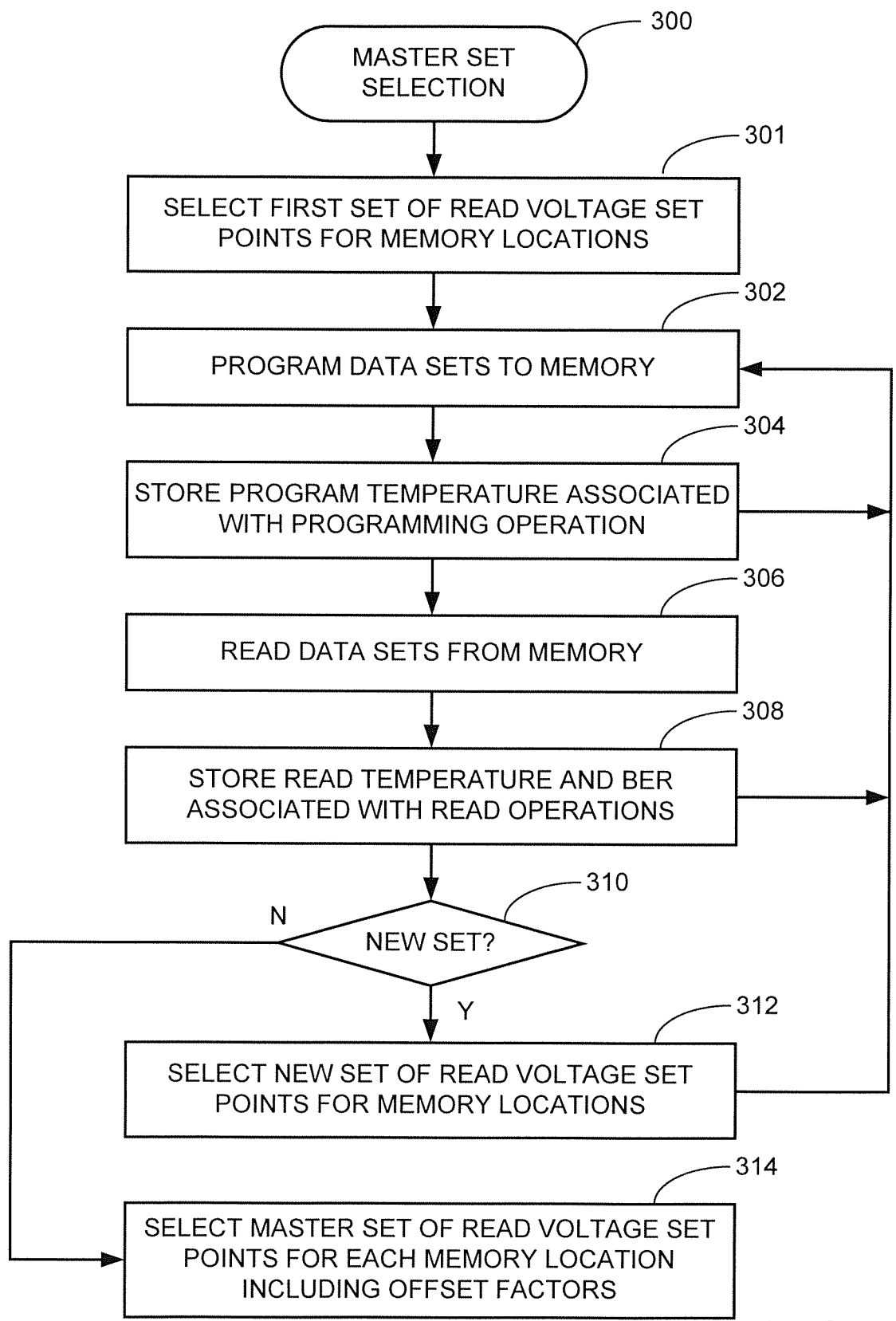
FIG. 12 is a flow chart for a master set selection routine.

FIG. 12 is a flow chart for a master set selection routine 300 to provide an overview of the manner in which the circuit 200 from FIG. 8 can operate to select master set points for various locations in the memory 140. The operations can be carried out to accumulate data both during normal read operations to service host commands as well as during various background calibration operations.

An initial set of read voltage set points is selected for each memory location being evaluated at step 301. The initial set can be derived using a variety of processes, including from a calibration process in which test data are read and increments are added and subtracted from various base voltages to arrive at a final set that provides optimum error rate performance. Thereafter, various program operations are carried out to write data to the respective locations, step 302, and the programming temperature (Tprog) is measured for each write, step 304.

The written data are subsequently read as required, step 306, and the temperature during reading (Tread), a measured or estimated BER, and as desired, various other parameters such as read counts, PE counts, etc. are measured at step 308. The foregoing operations are carried out as required, and the associated history data are accumulated in local memory.

Decision step 310 determines whether sufficient data have been accumulated and a new set of read voltage set points should be evaluated; if so, new values are determined and the process continues (step 312). It will be appreciated that the system may operate to adaptively adjust the read voltage set points over time in response to read errors (both base values as well as increments), and new set points may also be periodically established by performing a separate read calibration operation. Nonetheless, the circuit is not just obtaining a particular set, but rather is endeavoring to evaluate and identify performance over many different sets over the full expected range of CTD, as discussed above in FIG. 11.

Accordingly, when sufficient history data have been accumulated, the process passes from step 310 to step 314 where the circuit 200 selects the optimum (master) set for each location. The data accumulated during the routine may further inform the system for additional adjustments that can be made for individual locations or other factors.

The evaluation of the flash memory 140 during the routine of FIG. 12 can further be characterized as including the various steps in some embodiments. First, a set of read voltages for each Rn for different cross-temperatures or range of cross-temperatures are obtained as a function of PE-cycle, retention, read disturb, and WLn/Page#. These are defined as custom read voltages.

Next, sweep window parameters +dV, −dV, and voltage step size for calibration are determined as a function of PE-cycle, retention, read disturb, and WLn/Page#.

During an error recovery operation, a delta value dTpc is determined between the current temperature (Tcurrent) and Tprog for each failing GCU or failing stripe. The custom read voltages can be used in an effort to correct the errors. If needed, soft LDPC can be applied using the custom read voltages. Furthermore, calibration can be applied over the sweep window with the pre-determined voltage step sizes selected above. The sweep window would thus range from the custom read voltages +/−dV.

From this, the system can operate to determine the read voltages with the minimum error metric (e.g., BER, fail bits, disparity error count, syndrome weight count) within sweep window. This best performing set can be defined as the master (optimized) read voltage set points for the applicable temperature range and stored, used and adjusted as described above.

Figure 13:
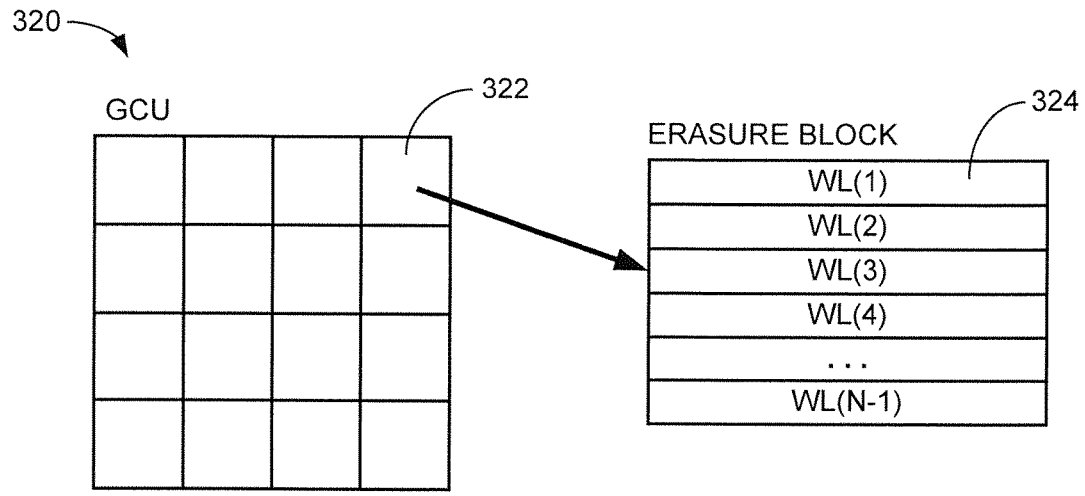
FIG. 13 shows an arrangement of a garbage collection unit (GCU), erasure blocks and word lines of the flash memory in some embodiments.

An example of adjustments to the optimized master set can be illustrated from a review of FIG. 13, which shows a garbage collection unit (GCU) 320 made up of a number of erasure blocks 322. As discussed previously, GCUs are allocated and erased as a unit, and may utilize one (or more) erasure blocks on each of a plurality of the semiconductor dies (see FIG. 2). Erasure blocks represent the smallest portion of the flash memory that can be erased at a time, and each erasure block is made up of some selected number N of word lines 324, as shown.

Accordingly, in some embodiments a master set of read voltage set points may be generated for each erasure block 322 in the system. From there, adjustments can be made to the individual values (e.g., R1-R7) for other factors. For example, it may be determined that the first word line 324 (WL(1)) in each erasure block 322 tends to require higher read voltage levels as compared to other word lines, etc. Accordingly, the master set can be adjusted accordingly on an individual word line (or page) basis, or for groups of word lines, as required.

Figure 14:
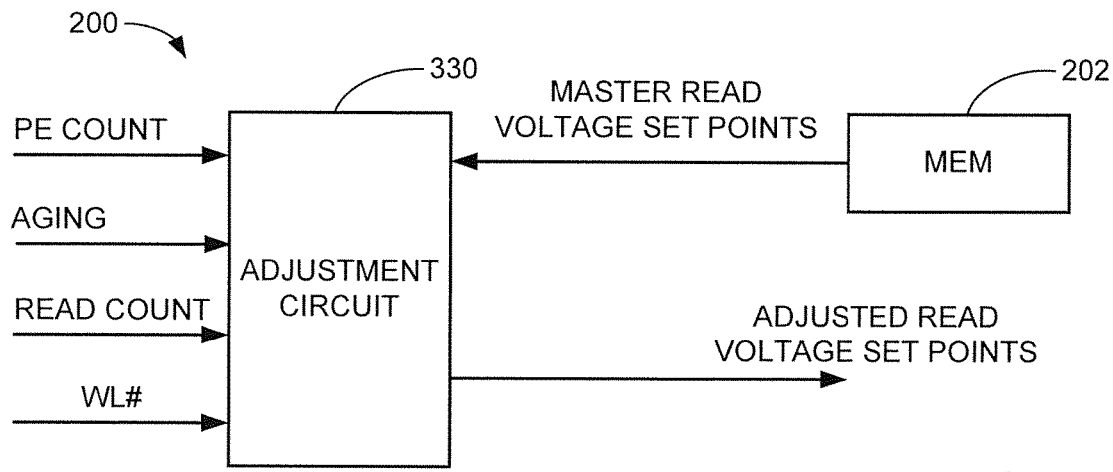
FIG. 14 illustrates an adjustment circuit of the management circuit in further embodiments.

Other factors mentioned above that can be used to provide adjustments to the master set include PE counts, aging, read counts, etc. These and other parameters are represented in FIG. 14 as being received and processed by an adjustment circuit 330 of the management circuit 200 of FIG. 8 to form and output an adjusted set of read voltage set points based on the master set. In one example, a final adjusted set R(adj) can be established based on the master set (Rmaster) as follows:

$$R(adj)=R(master)+A(PE)+B(AGE)+C(RC)+D \quad (1)$$

Where PE is the PE count, AGE is the data aging, RC is the read count, and A, B, C, and D are constants. Higher order relationships can be developed and used based on the observed operation of the memory. In some cases, these relationships can be developed and used for a class of nominally identical memory devices, or can be individually tuned as required.

Figure 15:
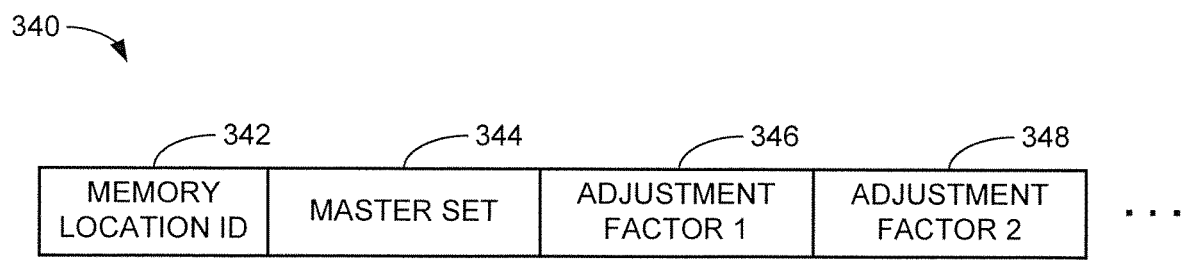
FIG. 15 shows a data structure that may be stored in memory and used by the management circuit in some embodiments.

FIG. 15 shows a data structure 340 that can further be stored in a suitable memory such as the memory 202 of the circuit 200. Other arrangements can be used. The data structure 340 can include a memory location ID 342, the associated master set 344, and then various adjustment factors 346, 348, etc. In this way, the circuit 330 can recall these values, combine them with the current parametric state of the memory location, and output the final required set of read voltage levels.

It is to be understood that even though numerous characteristics and advantages of various embodiments of the present disclosure have been set forth in the foregoing description, together with details of the structure and function of various embodiments of the disclosure, this detailed description is illustrative only, and changes may be made in detail, especially in matters of structure and arrangements of parts within the principles of the present disclosure to the full extent indicated by the broad general meaning of the terms in which the appended claims are expressed.

What is claimed is:

1. A method comprising:
    applying a plurality of sets of read voltages to a group of non-volatile memory (NVM) cells to read first data from the NVM cells over a range of cross-temperature differential (CTD) values comprising a difference between a programming temperature at which the first data are programmed to the NVM cells and a reading temperature at which the first data are subsequently read from the NVM cells;
    selecting a master set of read voltages for the group of NVM cells from the plurality of sets of read voltages that provide a lowest error rate across the range of the CTD values; and
    using the master set of read voltages to sense second data programmed to the NVM cells independently of a selected reading temperature of the NVM cells.

2. The method of claim 1, wherein the master set of read voltages are associated with a selected erasure block or a subset of erasure blocks of the NVM each comprising a plurality of word lines to which the NVM cells are coupled, and wherein the using step comprises adjusting the master set of read voltages responsive to the word lines of the erasure block or the subset of erasure blocks to provide a first adjusted set of read voltages for a first word line and a different, second adjusted set of read voltages for a second word line.

3. The method of claim 1, wherein the using step further comprises adjusting the master set of read voltages by an adjustment factor to provide an adjusted set of read voltages, the adjustment factor comprising at least a selected one of a program/erase count, a read count, or a data aging count for the group of NVM cells.

4. The method of claim 1, further comprising measuring an error rate for each of a plurality of read operations at different CTD values for each of the wherein the sets of read voltages.

5. The method of claim 1, wherein the NVM cells are characterized as three level cells (TLCs) having eight (8) charge levels to store three (3) bits of data each, and wherein the plurality of sets of read voltages and the master set of read voltages each have at least seven (7) different read voltage levels R1 through R7.

6. The method of claim 1, wherein the master set of read voltages is a first master set of read voltages for a first range of the CTD values that extends from a minimum CTD value to a cross-over CTD value, and the method further comprises selecting a second master set of read voltages for use over an adjacent second range of the CTD values that extends from the cross-over CTD value to a maximum CTD value.

7. The method of claim 1, wherein the sets of read voltages are applied to read the first data responsive to a sequence of host read commands to transfer the first read data from the NVM to a host device.

8. The method of claim 1, wherein the sets of read voltages are applied during a background calibration operation in which the first data are not transferred to a host device.

9. The method of claim 1, wherein the NVM is a NAND flash memory of a solid-state drive (SSD).

10. The method of claim 1, wherein the applying step comprises determining a syndrome weight from a low density parity check (LDPC) circuit used to decode the first read data, wherein the master set of read voltages provides a lowest syndrome weight across the CTD range.

11. A storage device comprising:
a non-volatile memory (NVM) comprising programmable memory cells;
a controller circuit configured to transfer user data between the NVM and a host device coupled to the storage device responsive to host read commands; and
a read voltage set point (RVSP) management circuit configured to apply a plurality of sets of read voltages to a group of non-volatile memory (NVM) cells to read first data from the NVM cells over a range of cross-temperature differential (CTD) values comprising a difference between a programming temperature at which the first data are programmed to the NVM cells and a reading temperature at which the first data are subsequently read from the NVM cells, to select a master set of read voltages for the group of NVM cells from the plurality of sets of read voltages that provide a lowest error rate across the range of the CTD values, and to use the master set of read voltages to sense second data programmed to the NVM cells independently of a selected reading temperature of the NVM cells.

12. The storage device of claim 11, wherein the master set of read voltages are associated with a selected erasure block of the NVM comprising a plurality of word lines to which the NVM cells are coupled, and wherein the RSVP management circuit comprises an adjustment circuit that adjusts the master set of read voltages responsive to the word lines to provide a first adjusted set of read voltages for a first word line and a different, second adjusted set of read voltages for a second word line.

13. The storage device of claim 11, wherein the first and second data are stored to the NVM in the form of low density parity check (LDPC) code words having a user data portion and a code portion, and wherein the error rate data comprises a syndrome weight as a number of LDPC errors during decoding of the LDPC code words.

14. The storage device of claim 11, wherein the error rate data comprises a calculated bit error rate (BER) for the first data.

15. The storage device of claim 11, characterized as a solid-state drive (SSD), the NVM comprising a NAND flash memory with flash memory cells, the controller circuit and the RVSP control circuit realized as one or more programmable processors that use programming instructions in a memory in the form of firmware.

16. The storage device of claim 15, wherein the flash memory cells are characterized as three level cells (TLCs) having eight (8) charge levels to store three (3) bits of data each, and wherein the initial set of read voltage set points and the master set of read voltage set points each have at least seven (7) different read voltage levels R1 through R7 to differentiate among the 8 charge levels.

17. The storage device of claim 15, wherein the flash memory cells are arranged as erasure blocks having a plurality of word lines to which different sets of the flash memory cells are coupled to store pages of data, and wherein the RVSP management circuit further generates a separate master set of read voltage set points for each erasure block and includes an adjustment circuit that adjusts the master set of read voltages set points for different word lines in the associated erasure block.

18. The storage device of claim 11, wherein the sets of read voltages are applied to read the first data responsive to a sequence of host read commands to transfer the first read data from the NVM to a host device.

19. The storage device of claim 11, wherein the initial set of read voltage set points is generated using a read voltage calibration operation where individual read voltages are incrementally adjusted to obtain a set of read voltages at a selected temperature that provides acceptable error rate performance.

* * * * *